US012571488B2

(12) United States Patent
Tatara et al.

(10) Patent No.: US 12,571,488 B2
(45) Date of Patent: Mar. 10, 2026

(54) VALVE ELEMENT AND METHOD FOR MANUFACTURING VALVE ELEMENT

(71) Applicant: OMRON HEALTHCARE Co., Ltd., Kyoto (JP)

(72) Inventors: Yoshitaka Tatara, Tokyo (JP); Yuuki Uchida, Tokyo (JP); Takanori Nishioka, Kyoto (JP); Yoshihide Tokko, Kyoto (JP); Yoshihiko Sano, Kyoto (JP)

(73) Assignee: OMRON HEALTHCARE CO., LTD., Kyoto (JP)

( * ) Notice: Subject to any disclaimer, the term of this patent is extended or adjusted under 35 U.S.C. 154(b) by 52 days.

(21) Appl. No.: 18/442,597

(22) Filed: Feb. 15, 2024

(65) Prior Publication Data

US 2024/0183464 A1     Jun. 6, 2024

Related U.S. Application Data

(63) Continuation of application No. PCT/JP2022/048368, filed on Dec. 27, 2022.

(30) Foreign Application Priority Data

Jan. 7, 2022     (JP) ................................. 2022-001870

(51) Int. Cl.
| | |
|---|---|
| *F16K 99/00* | (2006.01) |
| *B81B 3/00* | (2006.01) |
| *B81C 1/00* | (2006.01) |
| *F16K 7/14* | (2006.01) |
| *F16K 31/02* | (2006.01) |

(52) U.S. Cl.
CPC ...... *F16K 99/0051* (2013.01); *F16K 99/0015* (2013.01); *B81B 3/00* (2013.01);
(Continued)

(58) Field of Classification Search
CPC ............. F16K 99/0051; F16K 99/0015; F16K 2099/008; F16K 7/14; F16K 31/02; B81B 3/00; B81C 1/00
(Continued)

(56) References Cited

U.S. PATENT DOCUMENTS

| | | | | |
|---|---|---|---|---|
| 4,581,624 A | * | 4/1986 | O'Connor ................. | F15C 5/00 216/2 |
| 5,065,978 A | * | 11/1991 | Albarda ................ | F04B 43/046 257/419 |

(Continued)

FOREIGN PATENT DOCUMENTS

| | | |
|---|---|---|
| JP | 63-307959 A | 12/1988 |
| JP | 9-137872 A | 5/1997 |

(Continued)

OTHER PUBLICATIONS

International Search Report; Mar. 28, 2023; PCT /JP2022/048368.

*Primary Examiner* — Minh Q Le

(74) *Attorney, Agent, or Firm* — Colson Law Group, PLLC

(57) ABSTRACT

Valve element for controlling flow of fluid, including: a first movable electrode portion including a fluid introduction port through which the fluid flows; a second movable electrode portion including a discharge port through which the fluid is discharged, the second movable electrode portion being disposed to cover the fluid introduction port, with an interval between the second movable electrode portion and the first movable electrode portion; a spacer portion configured to secure the interval between the first movable electrode portion and the second movable electrode portion; and a frame portion configured to form a back chamber that communicates with the fluid introduction port and configured to support the first movable electrode portion, wherein the first movable electrode portion and the second movable
(Continued)

electrode portion can be drawn together by an electrostatic attractive force generated by applying a voltage to the first and second movable electrode, sealing the fluid introduction port.

3 Claims, 6 Drawing Sheets

(52) U.S. Cl.
    CPC .................. *B81C 1/00* (2013.01); *F16K 7/14* (2013.01); *F16K 31/02* (2013.01); *F16K 2099/008* (2013.01)

(58) Field of Classification Search
    USPC ........... 251/129.01, 331; 137/414, 451, 859, 137/601.14
    See application file for complete search history.

(56) References Cited

U.S. PATENT DOCUMENTS

| | | | | |
|---|---|---|---|---|
| 5,180,623 | A * | 1/1993 | Ohnstein | F16K 99/0001 |
| | | | | 428/209 |
| 5,244,537 | A * | 9/1993 | Ohnstein | F15C 5/00 |
| | | | | 216/18 |
| 6,182,941 | B1 * | 2/2001 | Scheurenbrand ... | F16K 99/0051 |
| | | | | 137/554 |
| 7,993,606 | B2 * | 8/2011 | Trentacosta | B01D 69/02 |
| | | | | 2/457 |
| 8,048,371 | B1 * | 11/2011 | Kapur | G05D 23/192 |
| | | | | 422/50 |
| 8,323,577 | B2 * | 12/2012 | Kapur | B32B 38/04 |
| | | | | 422/50 |
| 2005/0249917 | A1 * | 11/2005 | Trentacosta | B01J 20/28033 |
| | | | | 428/137 |
| 2013/0313452 | A1 * | 11/2013 | Tice | F16K 31/02 |
| | | | | 251/129.01 |
| 2018/0187668 | A1 | 7/2018 | Corigliano et al. | |
| 2020/0139368 | A1 * | 5/2020 | Mou | F04B 53/1072 |
| 2020/0326010 | A1 * | 10/2020 | Duqi | F16K 31/005 |
| 2022/0224251 | A1 * | 7/2022 | Saneyoshi | B81B 3/00 |
| 2022/0232328 | A1 * | 7/2022 | Mawatari | H04R 31/003 |
| 2023/0336157 | A1 * | 10/2023 | Huang | B81C 1/00 |

FOREIGN PATENT DOCUMENTS

| | | |
|---|---|---|
| JP | 2000-266224 A | 9/2000 |
| JP | 2019-93120 A | 6/2019 |

* cited by examiner

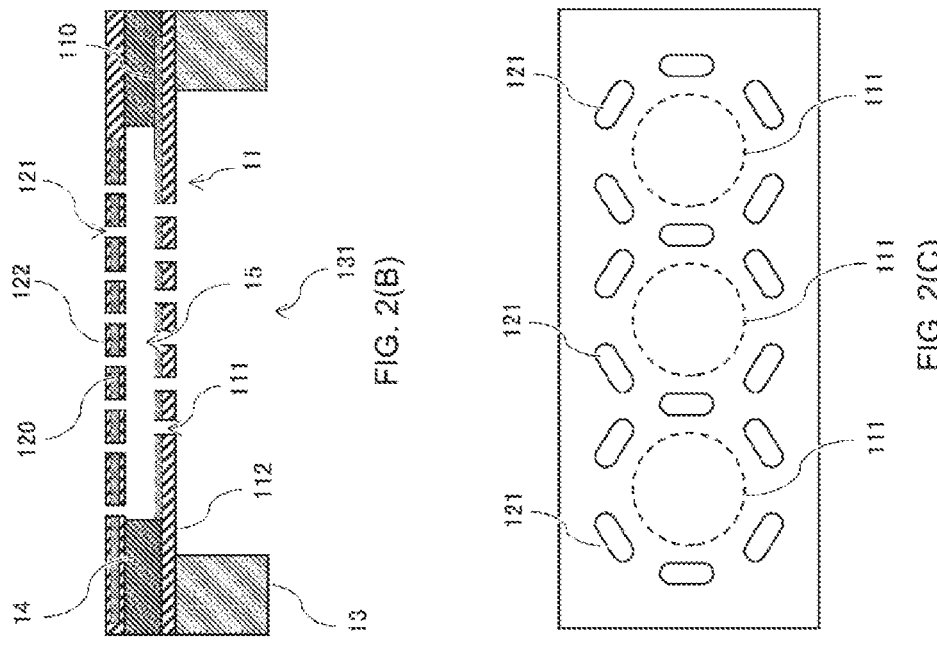
FIG. 2(B)
FIG. 2(C)
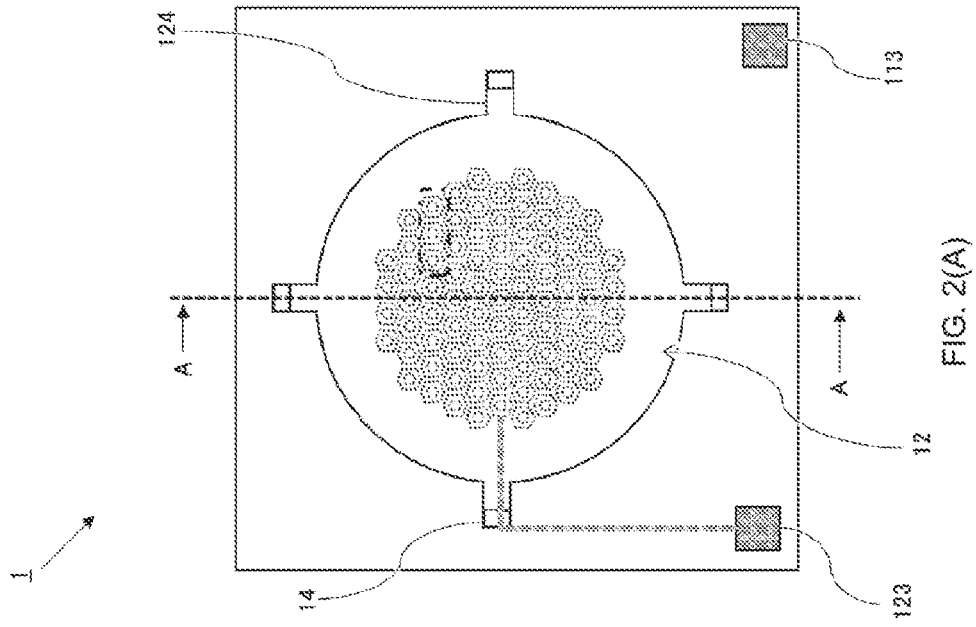
FIG. 2(A)

VALVE ELEMENT AND METHOD FOR MANUFACTURING VALVE ELEMENT

CROSS-REFERENCE TO RELATED APPLICATIONS

This application is the U.S. national stage application filed pursuant to 35 U.S.C. 365(c) and 120 as a continuation of International Patent Application No. PCT/JP2022/048368, filed Dec. 27, 2022, which application claims priority to Japanese Patent Application No. 2022-001870, filed Jan. 7, 2022, which applications are incorporated herein by reference in their entireties.

TECHNICAL FIELD

The present invention relates to a valve element and a method for manufacturing a valve element.

BACKGROUND ART

As a valve element for controlling flow of a fluid, there has been known a valve element having a structure in which two electrode portions disposed to face each other are provided, an electrostatic attractive force is generated by applying a voltage to each electrode of the two electrode portions, and a fluid introduction port provided in one electrode portion is sealed by another electrode portion (for example, Patent Document 1). FIG. 1(A) and FIG. 1(B) each provide a schematic view of a valve element 9 of such a structure.

FIG. 1(A) provides a schematic cross-sectional view of the valve element 9 in a valve "open" state, and FIG. 1(B) provides a schematic cross-sectional view of the valve element 9 in a valve "closed" state. As illustrated in FIG. 1(A) and FIG. 1(B), the valve element 9 is configured such that a fluid is introduced from a fluid introduction port 92 provided in a substrate 91 (fixed electrode), and the fluid is discharged from a discharge port (not illustrated) provided in a diaphragm 93 (movable electrode) formed to be movable with respect to the substrate 91. When an electrostatic attractive force is generated by applying a voltage between the substrate 91 (fixed electrode) and the diaphragm 93 (movable electrode), the diaphragm 93 is drawn to the substrate 91 by the attractive force, and the fluid introduction port 92 can be sealed by the diaphragm 93. In this manner, a flow rate of the fluid can be controlled by shutting off the flow of the fluid or adjusting an applied voltage to adjust a distance between the diaphragm 93 and the substrate 91.

The electrostatic attractive force in this case can be expressed by the following equation (1).

[Mathematical Equation 1]

$$F = \frac{\varepsilon S V^2}{2d^2} \tag{1}$$

In the above equation (1), F represents an electrostatic attractive force, $\varepsilon$ represents a dielectric constant of air, S represents an area where both electrodes face each other, V represents an applied voltage, and d represents a distance between both electrodes. That is, the electrostatic attractive force F greatly depends on the applied voltage V and the inter-electrode distance d, and when the applied voltage V is decreased or the inter-electrode distance d is increased, the electrostatic attractive force F becomes remarkably weak, and the driving force for driving the valve (i.e., drawing the diaphragm 93 to the substrate 91 side) is decreased.

On the other hand, from the viewpoint of the discharge characteristics of the fluid, the larger the distance between the two electrodes is, and the larger the areas of the fluid introduction port 92 and the discharge port are (i.e., the smaller the facing area between the two electrodes is), the more efficiently the fluid can be discharged.

As described above, in the conventionally known valve driven by the electrostatic attractive force, it is necessary to secure a certain distance between both electrodes in order to obtain good fluid discharge characteristics when the valve is in the "open" state. Then, in order to obtain the electrostatic attractive force F sufficient as the driving force of the valve, adjustment is performed by increasing the electrode area S or by increasing the applied voltage V. In other words, it has been difficult to achieve both miniaturization and low power consumption of the valve element while achieving good fluid discharge characteristics.

On the other hand, in a normally closed microvalve formed by bonding two semiconductor substrates to each other, there has been proposed a technique of bringing the valve into the "open" state by bending the two semiconductor substrates in opposite directions to each other by a thermal drive system using a bimetal (for example, Patent Document 2). According to such a means, the distance between a valve port and a valve body can be increased as compared with the case where only one of the substrates is bent, and good fluid discharge characteristics can be obtained with low power consumption.

CITATION LIST

Patent Literature

Patent Document 1: JP 63-307959 A
Patent Document 2: JP 2000-266224 A

SUMMARY OF INVENTION

Technical Problem

However, in the microvalve disclosed in Patent Document 2, the electrodes for driving the valve are provided on the upper and lower surfaces (front and back surfaces) of the valve element, and wiring needs to be provided on both the upper and lower surfaces of the valve element. In addition, the microvalve is manufactured by bonding two substrates together, which requires accurate wafer alignment in order to properly bond them together. That is, in order to manufacture the microvalve described in Patent Document 2, the manufacturing step becomes complicated, and the manufacturing difficulty becomes high.

The present invention has been made in view of the above-described problems, and an object of the present invention is to provide a technique capable of achieving both miniaturization and low power consumption of a valve element of a type that is driven using an electrostatic attractive force by a simple manufacturing step.

Solution to Problem

The present invention adopts the following configurations to solve the above-described problems. That is, a valve element for controlling flow of a fluid, the valve element including:

a first movable electrode portion including a fluid introduction port through which the fluid flows;

a second movable electrode portion including a discharge port through which the fluid is discharged, the second movable electrode portion being disposed on one surface side of the first movable electrode portion to cover the fluid introduction port, with an interval between the second movable electrode portion and the first movable electrode portion;

a spacer portion configured to secure the interval between the first movable electrode portion and the second movable electrode portion; and a frame portion configured to form a back chamber that communicates with the fluid introduction port on another surface side of the first movable electrode portion and configured to support the first movable electrode portion, wherein the first movable electrode portion and the second movable electrode portion is drawn together by an electrostatic attractive force generated by applying a voltage to each electrode of the first movable electrode portion and the second movable electrode portion to seal the fluid introduction port.

By providing a configuration in which a valve port (the fluid introduction port of the first movable electrode portion) and a structure (the second movable electrode portion) sealing the valve port are drawn together by the electrostatic attractive force as described above, it is possible to increase the distance of approach between both electrodes when the same voltage is applied as compared with the case where one side is a fixed electrode. This makes it possible to increase the distance between the two electrodes when the valve is in the "open" state without changing the applied voltage, as compared with the case where one side is a fixed electrode.

In this manner, it is possible to obtain good fluid discharge characteristics, to reduce the applied voltage when closing the valve without increasing the electrode area, and to realize miniaturization and low power consumption of the valve element. Further, with the above-described configuration, since each component can be manufactured by layering thin films on one semiconductor substrate, the component can be easily manufactured by a semiconductor manufacturing step.

The valve element may include a plurality of sets of the fluid introduction port and the discharge port corresponding to the fluid introduction port. In addition, the sets of the fluid introduction port and the discharge port corresponding to the fluid introduction port may be arranged in an array.

According to such a configuration, it is possible to further improve the fluid discharge characteristics when the valve is "open", and it is possible to obtain good fluid discharge characteristics even when the distance between the electrodes is reduced. Thus, the valve element can be further miniaturized.

The present invention can also be viewed as a method for manufacturing a valve element for controlling flow of a fluid, the method including:

a first electrode film forming step of forming, on or above a semiconductor substrate, a first movable electrode film including a first movable electrode and a fluid introduction port through which the fluid flows;

a sacrificial layer film forming step of forming, on or above the first movable electrode film and the semiconductor substrate, a sacrificial layer film of an insulating material;

a second electrode film forming step of forming, on or above the sacrificial layer film, a second movable electrode film including a second movable electrode and a discharge port through which the fluid is discharged;

a connection electrode forming step of forming a first connection electrode connected to the first movable electrode and a second connection electrode connected to the second movable electrode;

a back chamber forming step of forming a back chamber in the semiconductor substrate; and a sacrificial layer film etching step of etching the sacrificial layer film while leaving a spacer portion configured to secure an interval between the first movable electrode film and the second movable electrode film.

Note that the configurations described above can be combined with one another to constitute the present invention unless the combination leads to technical contradiction.

Advantageous Effects of Invention

According to the present invention, it is possible to provide a technique capable of achieving both miniaturization and low power consumption of a valve element of a type that is driven using an electrostatic attractive force by a simple manufacturing step.

BRIEF DESCRIPTION OF DRAWINGS

FIG. 2(A) is a plan view schematically illustrating a valve element according to Example 1 of the present invention. FIG. 2(B) is a first view illustrating a schematic cross section of the valve element according to Example 1 of the present invention. FIG. 2(C) is a view illustrating details of an introduction port and a discharge port according to Example 1 of the present invention.

DESCRIPTION OF EMBODIMENTS

Application Example

Figures 1A, 1B:
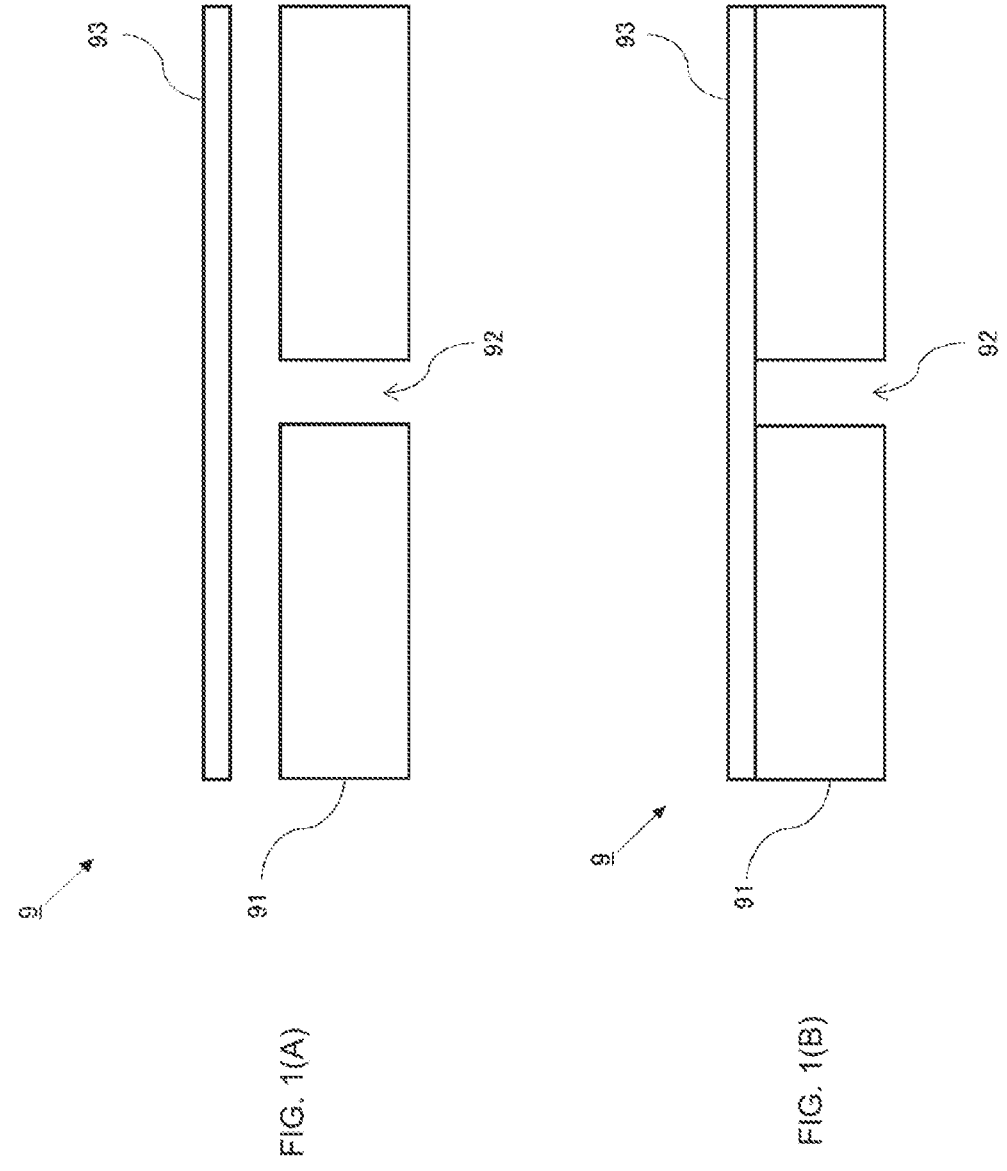
FIG. 1(A) is a first view schematically illustrating a valve element of a conventionally known type in which a valve is driven by an electrostatic attractive force.
FIG. 1(B) is a second view schematically illustrating a valve element of the conventionally known type in which a valve is driven by an electrostatic attractive force.

An overview of application examples of the present invention will be described below with reference to some drawings. The present invention can be applied as a valve element 1 of a micro electro mechanical system (MEMS) valve manufactured by a semiconductor manufacturing step, for example. FIG. 2(A), FIG. 2(B), and FIG. 2(C) are each a view schematically illustrating the valve element 1 according to the present application example. FIG. 2(A) is a plan view schematically illustrating the valve element 1 according to the application example. FIG. 2(B) is a schematic cross-sectional view illustrating a cross section taken along line AA of the valve element 1 in FIG. 2(A) in a valve "open" state, but both ends of the cross section are omitted. FIG. 2(C) is an enlarged view of a portion surrounded by a one dot chain line in FIG. 2(A) and is a view for describing shapes and arrangements of an introduction port 111 and a discharge port 121, both of which will be described below.

The valve element 1 generally includes a frame portion 13 made of a semiconductor, and a first movable electrode portion 11 and a second movable electrode portion 12 formed on the frame portion 13. Each of the first movable electrode portion 11 and the second movable electrode portion 12 is formed in a thin film shape having flexibility, is insulated by a spacer portion 14, and is disposed at a predetermined interval.

The frame portion 13 is constituted by a semiconductor substrate or the like, and includes a back chamber 131 serving as a flow path of a fluid flowing into the valve. The first movable electrode portion 11 is provided with a plurality of the introduction ports 111 for introducing the fluid, and the second movable electrode portion 12 is provided with a plurality of the discharge ports 121 for discharging the fluid. Note that the introduction ports 111 and the discharge ports 121 are schematically illustrated in FIG. 2(A), and specific shapes and arrangement relationships thereof will be described in detail below.

As illustrated in FIG. 2(B), when the valve is in the "open" state, a hollow portion 15 is formed between the second movable electrode portion 12 and the first movable electrode portion 11. In this manner, when the valve is in the "open" state, the fluid can be circulated by introducing the fluid from the introduction ports 111 provided in the first movable electrode portion 11 and discharging the fluid from the discharge ports 121 provided in the second movable electrode portion 12.

The valve element 1 according to the present application example can open and close the valve by a so-called electrostatic drive system and control the flow of the fluid (control of the flow rate including shutoff of the flow). Specifically, by applying a voltage to a first movable electrode 110 of the first movable electrode portion 11 and a second movable electrode 120 of the second movable electrode portion 12 to generate an electrostatic attractive force between both electrodes and thereby drawing the second movable electrode portion 12 and the first movable electrode portion 11 to each other, it is possible to reduce the interval between the second movable electrode portion 12 and the first movable electrode portion 11 (that is, a volume of the hollow portion 15). The flow rate of the fluid can be controlled by changing the size of the interval. In addition, in a case where the second movable electrode portion 12 and the first movable electrode portion 11 are completely in close contact with each other, since the introduction ports 111 and the discharge ports 121 are provided at positions which do not overlap each other, it is possible to bring the valve into a "closed" state, that is, to shut off the flow of the fluid.

In the valve element 1 according to the present application example, since both the first movable electrode portion 11 and the second movable electrode portion 12 are movable members formed in a thin film shape, the first movable electrode portion 11 and the second movable electrode portion 12 are drawn together when the electrostatic attractive force is generated. Therefore, as compared with a conventional valve element in which one of the electrodes is constituted by a fixed electrode, the interval between the electrodes can be made large, and good fluid discharge characteristics can be obtained. Further, the valve can be brought into the "closed" state with a small applied voltage.

Example 1

Hereinafter, modes for carrying out the present invention will be described in more detail on the basis of an example with reference to the drawings (including drawings once described in the above application example) in order. However, the specific configurations described in the examples are not intended to limit the scope of the present invention only to them unless otherwise specified.

Configuration of Valve Element

As illustrated in FIG. 2(A), FIG. 2(B), and FIG. 2(C), the valve element 1 according to the present example can be used as a MEMS valve for supplying and discharging gas to and from a cuff of a blood pressure monitor, and generally includes the frame portion 13, the first movable electrode portion 11, and the second movable electrode portion 12. That is, since it has the same configuration as that of the valve element 1 described in the application example, detailed description of the contents described in the application example will be omitted. In the present specification, the same components are denoted by the same reference numerals.

The frame portion 13 is a hard substrate made of a semiconductor such as Si, and includes the back chamber 131 serving as a flow path of a fluid flowing into the valve.

The first movable electrode portion 11 is a thin film-shaped electrode member including the first movable electrode 110 made of, for example, Si, and is disposed over the upper surface side (the side illustrated in FIG. 2(A), the same applies hereinafter) of the frame portion 13. Note that the first movable electrode portion 11 includes an insulating film (for example, a SiN film) 112, and is thereby insulated from the frame portion 13. The first movable electrode 110 is connected to an electrode pad 113, and is electrically connected to an external power supply via the electrode pad 113 so that a voltage is applied thereto. Further, the first movable electrode portion 11 is provided with the plurality of introduction ports 111 for introducing the fluid into the valve. The arrangement and shape of the introduction ports 111 will be described below.

The second movable electrode portion 12 is a flexible thin-film electrode member formed by covering the second movable electrode 120 made of, for example, Si with an insulating film (for example, a SiN film) 122, and includes the plurality of discharge ports 121. The arrangement and shape of the discharge ports 121 will be described below. The second movable electrode portion 12 in the present example has a substantially circular shape in a plan view, and has a configuration in which a plurality of protruding portions 124 are disposed on a circumference. Then, in the protruding portions 124 on the circumference, a predetermined interval is provided from the upper surface side of the first movable electrode portion 11 by the spacer portion 14 made of an insulator, and the second movable electrode portion 12 is disposed to be insulated from the first movable electrode portion 11. As the material of the spacer portion 14, for example, silicon dioxide ($SiO_2$) or the like can be used, and a phosphorus silicon glass (PSG), a boron phosphorus silicon glass (BPSG) or the like may be used. The second movable electrode 120 is connected to an electrode pad 123, and is electrically connected to an external power supply via the electrode pad 123 so that a voltage is applied thereto.

Then, when a voltage is applied to both electrodes of the second movable electrode 120 and the first movable electrode 110, an electrostatic attractive force is generated, the second movable electrode portion 12 and the first movable electrode portion 11 are drawn together, and in a state where both are completely in close contact with each other, the introduction ports 111 are sealed by the second movable electrode portion 12, so that the valve is in a "closed" state. Since the driving of the valve by electrostatic attractive force has been described above, further description will be omitted.

Next, the introduction ports 111 of the first movable electrode portion 11 and the discharge ports 121 of the second movable electrode portion 12 will be described. FIG. 2(C) is an enlarged view of a portion surrounded by a one dot chain line in FIG. 2(A), and illustrates a positional relationship between the introduction ports 111 and the discharge ports 121. It should be noted that the introduction ports 111 indicated by a broken line in FIG. 2(C) are not actually seen in a plan view of the valve element 1, but is illustrated only for the purpose of understanding the shape and positional relationship thereof. As illustrated in FIG. 2(C), the introduction ports 111 and the discharge ports 121 form a set provided in an arrangement relationship in which the periphery of one introduction port 111 is surrounded by a plurality of the discharge ports 121 in a plan view. As a specific shape, the discharge ports 121 having an elliptical shape are provided at positions corresponding to each side of a hexagon surrounding the introduction port 111 having a circular shape. As illustrated in FIG. 2(A), the valve element 1 has a configuration in which a large number of sets of the introduction port 111 and the discharge port 121 are arranged in an array in a so-called honeycomb-structure mode.

In this manner, by adopting a configuration in which a large number of sets of the introduction port 111 and the discharge port 121 are arranged in an array, the flow path resistance of the fluid can be reduced, and the fluid can be efficiently discharged even when the interval between the first movable electrode portion 11 and the second movable electrode portion 12 is reduced. As a result, the voltage applied to electrostatically drive both electrode portions can also be reduced.

Method for Manufacturing Valve Element

Next, an example of a method for manufacturing the valve element 1 according to the present example will be described with reference to FIG. 3(A) to FIG. 3(F). It should be noted that each of FIG. 3(A) to FIG. 3(F) is a conceptual schematic cross-sectional view for convenience of description of the manufacturing step, and is different from an accurate cross-sectional view of any portion of the valve element 1. The valve element 1 can be manufactured by forming a thin film on a semiconductor substrate by a so-called semiconductor manufacturing step.

Figures 3A, 3B, 3C, 3D, 3E, 3F:
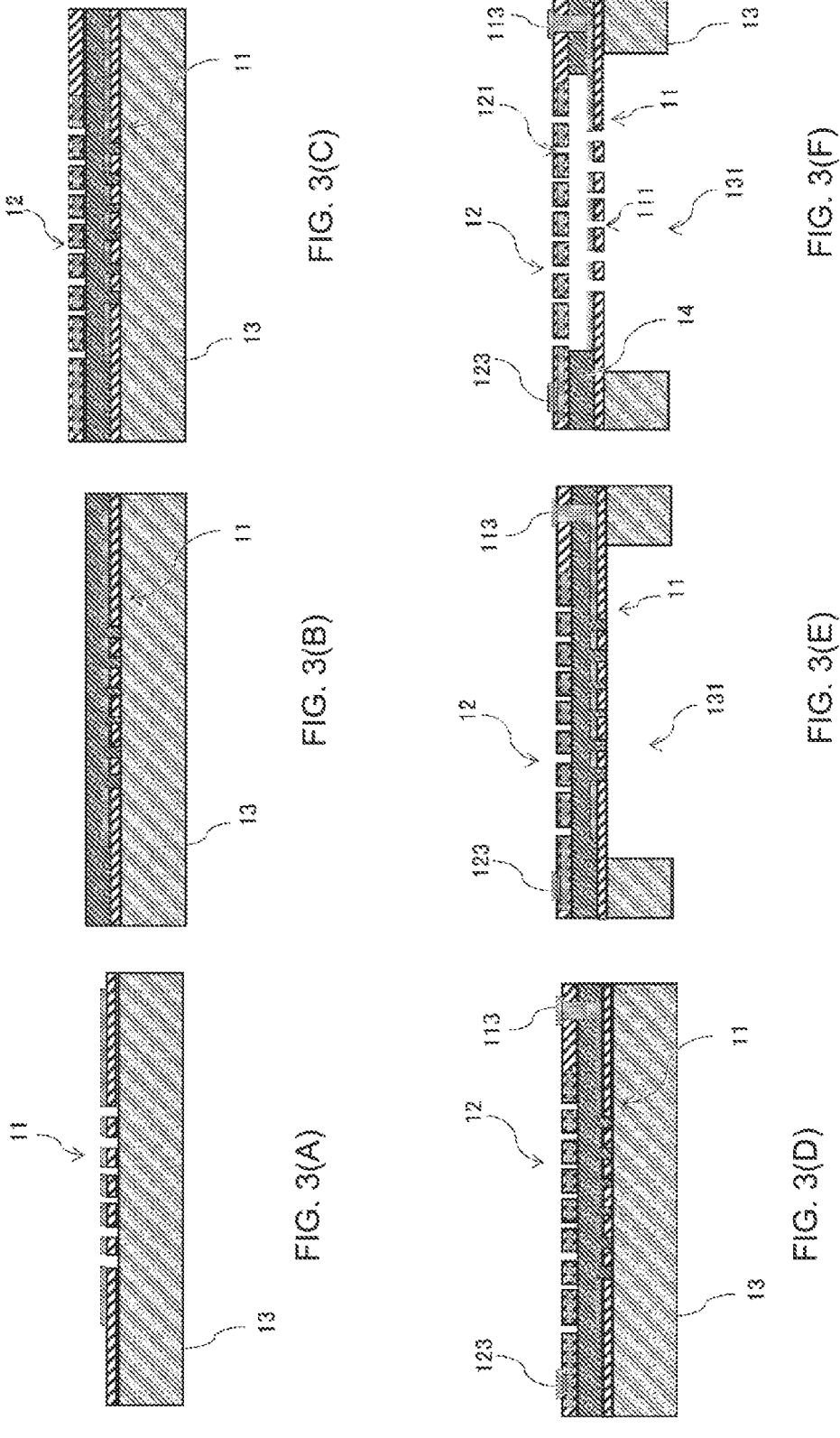
FIG. 3(A) is a first view illustrating a manufacturing step of the valve element according to Example 1 of the present invention.
FIG. 3(B) is a second view illustrating the manufacturing step of the valve element according to Example 1 of the present invention.
FIG. 3(C) is a third view illustrating the manufacturing step of the valve element according to Example 1 of the present invention.
FIG. 3(D) is a fourth view illustrating the manufacturing step of the valve element according to Example 1 of the present invention.
FIG. 3(E) is a fifth view illustrating the manufacturing step of the valve element according to Example 1 of the present invention.
FIG. 3(F) is a sixth view illustrating the manufacturing step of the valve element according to Example 1 of the present invention.

In the manufacturing flow of the valve element 1, first, a first movable electrode film serving as the first movable electrode portion 11 including the first movable electrode 110 and the introduction port 111 is formed on a silicon substrate constituting the frame portion 13. This step corresponds to a first electrode film forming step according to the present invention, and FIG. 3(A) is a schematic cross-sectional view illustrating a state after the step.

Next, on the first movable electrode film and the semiconductor substrate, a sacrificial layer film which will later serve as the spacer portion 14 is formed of an insulating material. This step corresponds to a sacrificial layer film forming step according to the present invention, and FIG. 3(B) is a schematic cross-sectional view illustrating a state after the step.

Subsequently, on the sacrificial layer film, a second movable electrode film serving as the second movable electrode portion 12 including the second movable electrode 120 and the discharge port 121 is formed. This step corresponds to a second electrode film forming step according to the present invention, and FIG. 3(C) is a schematic cross-sectional view illustrating a state after the step.

Next, the electrode pad 113 connected to the first movable electrode 110 and the electrode pad 123 connected to the second movable electrode 120 are formed. This step corresponds to a connection electrode forming step according to the present invention, and FIG. 3(D) is a schematic cross-sectional view illustrating a state after the step.

Further, the back chamber 131 is formed in the frame portion 13. This step corresponds to a back chamber forming step according to the present invention, and FIG. 3(E) is a schematic cross-sectional view illustrating a state after the step. Next, the sacrificial layer film is etched so as to leave the spacer portion 14 for securing the interval between the first movable electrode portion 11 and the second movable electrode portion 12. This step corresponds to the sacrificial layer film etching step according to the present invention, and FIG. 3(F) is a schematic cross-sectional view illustrating a state after the step.

The valve element 1 according to the present example can be manufactured by layering thin films on a single semiconductor substrate by the above-described steps, and can be easily manufactured. In addition, according to the valve element 1 of the present example, a good fluid discharge characteristics can be obtained without increasing the area of the electrode and without increasing the applied voltage. In other words, it is possible to easily manufacture a valve element that can be reduced in size and power consumption while having good fluid discharge characteristics.

Modification of Support Structure of Second Movable Electrode Portion

Figure 4A:
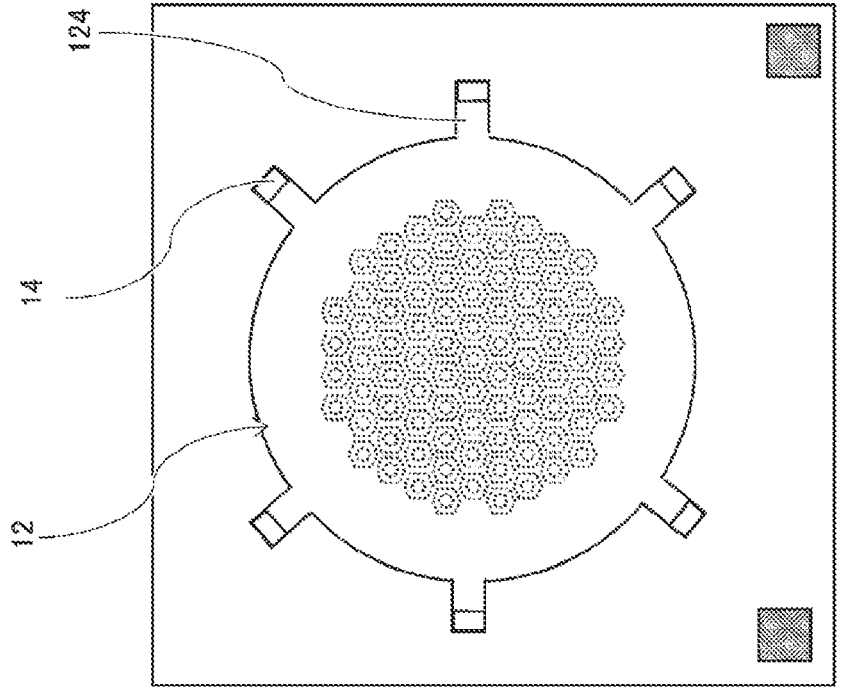
FIG. 4(A) is a first view illustrating a modification of the valve element according to Example 1.
Figure 4B:
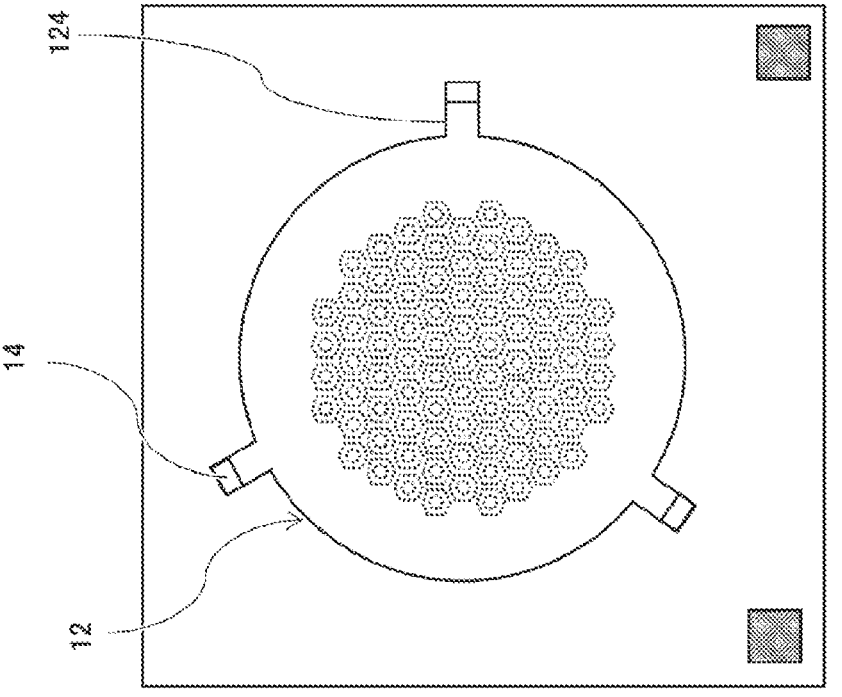
FIG. 4(B) is a second view illustrating a modification of the valve element according to Example 1.
Figure 5A:
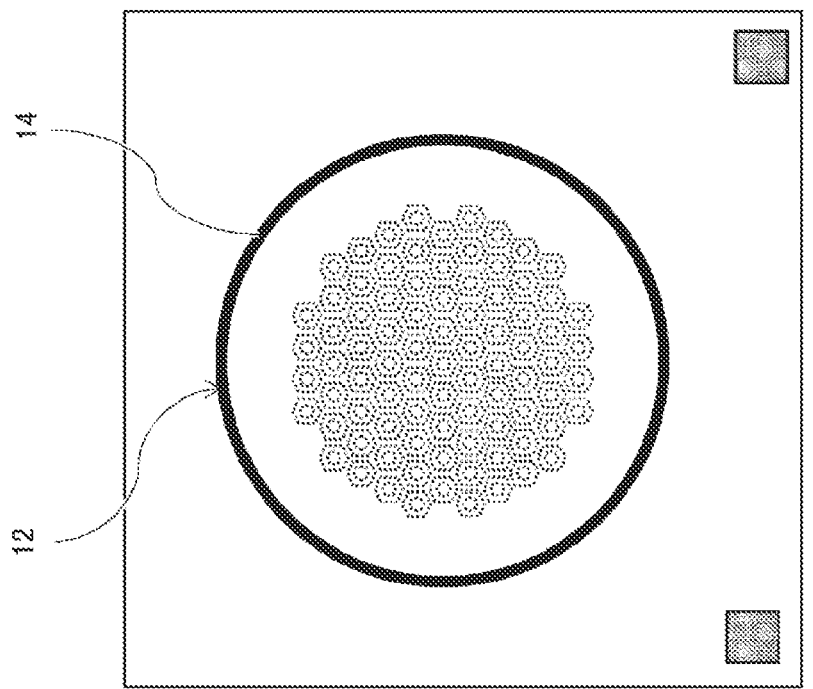
FIG. 5(A) is a third view illustrating a modification of the valve element according to Example 1.
Figure 5B:
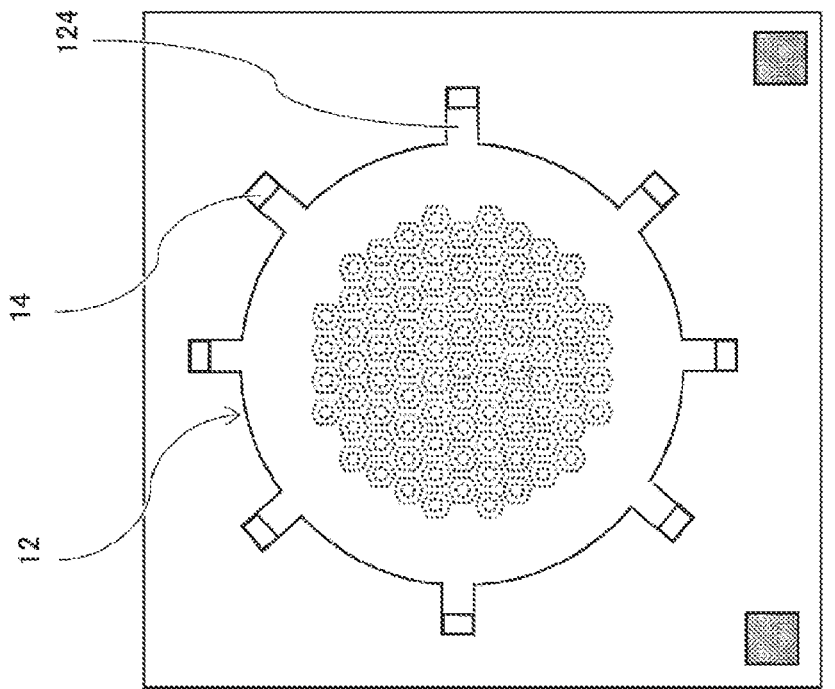
FIG. 5(B) is a fourth view illustrating a modification of the valve element according to Example 1.

In the example described above, the second movable electrode portion 12 is supported by the spacer portion 14 provided in the four protruding portions 124. However, the support structure of the second movable electrode portion 12 is not limited to such a configuration. FIG. 4(A), FIG. 4(B), FIG. 5(A), and FIG. 5(B) are views illustrating examples of other support structures of the second movable electrode portion 12. The second movable electrode portion 12 may be supported by the spacer portion 14 provided on the three protruding portions 124 as illustrated in FIG. 4(A), or may be supported by the spacer portion 14 provided on the six protruding portions 124 as illustrated in FIG. 4(B). The second movable electrode portion 12 may be supported by the spacer portion 14 provided on the eight protruding portions 124 as illustrated in FIG. 5(A), or may be supported by the spacer portion 14 provided over the entire outer periphery of the circular shape without providing the protruding portions as illustrated in FIG. 5(B).

Modifications of Introduction Port and Discharge Port

Further, in the example described above, the shape and arrangement relationship between the introduction ports 111 and the discharge ports 121 are such that the elliptical discharge ports 121 are provided at positions corresponding to each side of a hexagon surrounding the circular introduction port 111. However, various modifications are also possible. FIG. 6(A), FIG. 6(B), FIG. 6(C), and FIG. 6(D) are views illustrating other configurations of the introduction ports 111 and the discharge ports 121, respectively.

Figures 6A, 6B, 6C, 6D:
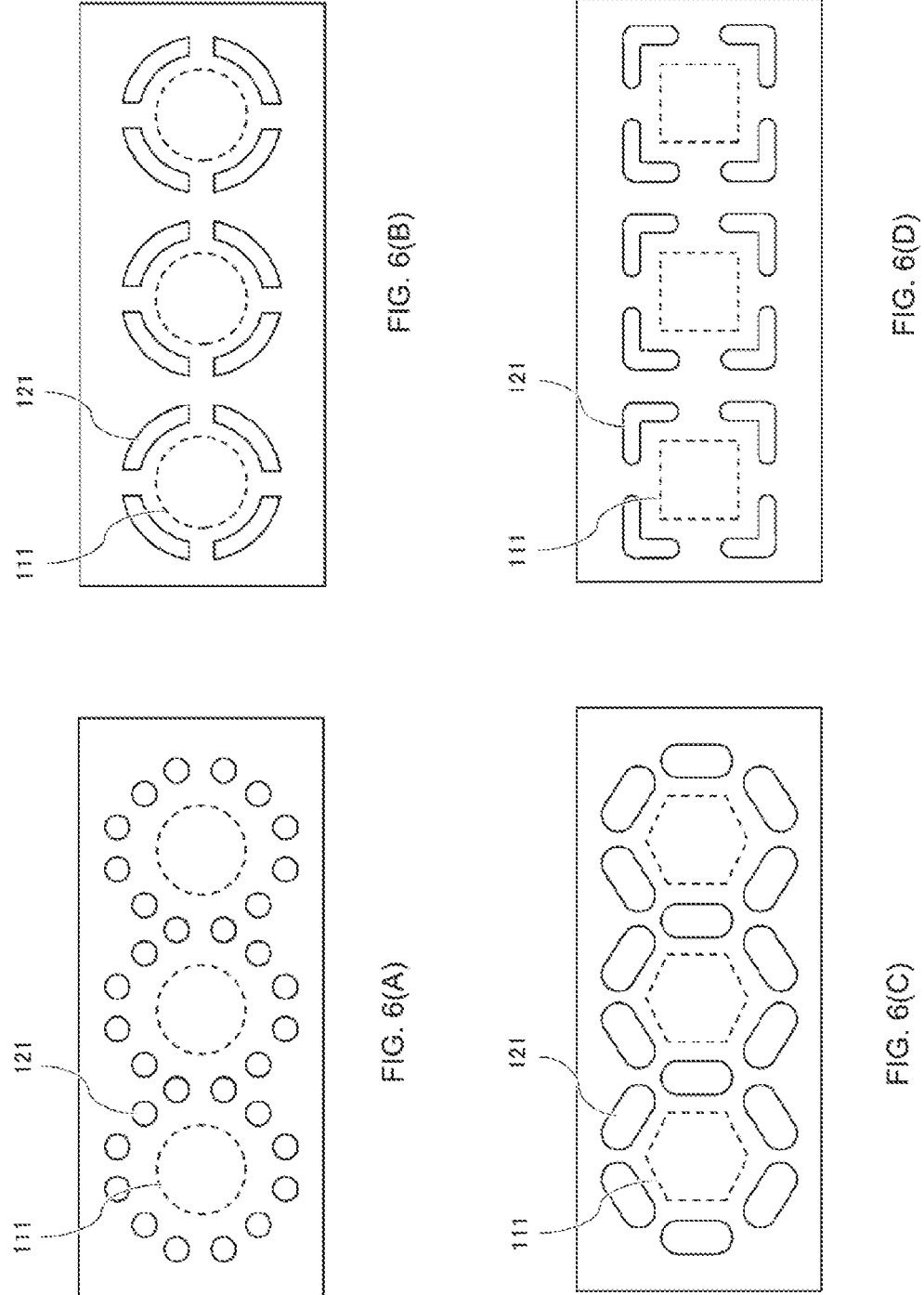
FIG. 6(A) is a fifth view illustrating a modification of the valve element according to Example 1.
FIG. 6(B) is a sixth view illustrating a modification of the valve element according to Example 1.
FIG. 6(C) is a seventh view illustrating a modification of the valve element according to Example 1.
FIG. 6(D) is an eighth view illustrating a modification of the valve element according to Example 1.

The shape and arrangement relationship between the introduction ports 111 and the discharge ports 121 may be such that the smaller circular discharge ports 121 are provided on the outer periphery of the circular introduction port 111 as illustrated in FIG. 6(A). The shape and arrangement relationship between the introduction ports 111 and the discharge ports 121 may be such that the discharge ports 121 having a shape obtained by quartering an annular ring are provided on the outer periphery of the circular introduction port 111 as illustrated in FIG. 6(B). The shape and arrangement relationship between the introduction ports 111 and the discharge ports 121 may be such that the elliptical discharge ports 121 are provided at a position corresponding to each side of a hexagon on the outer periphery of the hexagonal introduction port 111 as illustrated in FIG. 6(C). The shape and arrangement relationship between the introduction ports 111 and the discharge ports 121 may be such that the discharge ports 121 are provided along the outer periphery of each corner of the quadrangular introduction port 111 as illustrated in FIG. 6(D).

Other Points

The description of the examples described above is merely illustrative of the present invention, and the present invention is not limited to the specific embodiments described above. Within the scope of the technical idea of the present invention, various modifications and combinations may be made. For example, although the method for manufacturing the valve element by layering the thin film on the semiconductor substrate by the semiconductor manufacturing step has been exemplified in the above-mentioned example, the valve element according to the present invention may be manufactured by a method other than this.

Supplementary Note 1

A valve element (1) for controlling flow of a fluid, the valve element including: a first movable electrode portion (11) including a fluid introduction port (111) through which the fluid flows;

a second movable electrode portion (12) including a discharge port (121) through which the fluid is discharged, the second movable electrode portion being disposed on one surface side of the first movable electrode portion to cover the fluid introduction port, with an interval between the second movable electrode portion and the first movable electrode portion;

a spacer portion (14) configured to secure the interval between the first movable electrode portion and the second movable electrode portion; and a frame portion (13) configured to form a back chamber (131) that communicates with the fluid introduction port on another surface side of the first movable electrode portion and support the first movable electrode portion, wherein the first movable electrode portion and the second movable electrode portion is drawn together by an electrostatic attractive force generated by applying a voltage to each electrode of the first movable electrode portion and the second movable electrode portion to seal the fluid introduction port.

REFERENCE NUMERALS LIST

1 Valve element
11 First movable electrode portion
12 Second movable electrode portion
13 Frame portion
14 Spacer portion
15 Hollow portion
110 First movable electrode
111 Introduction port
112, 122 Insulating film
113, 123 Electrode pad
120 Second movable electrode
121 Discharge port

The invention claimed is:

1. A valve element for controlling flow of a fluid, the valve element comprising:

a first movable electrode portion including a fluid introduction port through which the fluid flows;

a second movable electrode portion including a discharge port through which the fluid is discharged, the second movable electrode portion being disposed on one surface side of the first movable electrode portion to cover the fluid introduction port, with an interval between the second movable electrode portion and the first movable electrode portion;

a spacer portion configured to secure the interval between the first movable electrode portion and the second movable electrode portion; and a frame portion configured to form a back chamber that communicates with the fluid introduction port on another surface side of the first movable electrode portion and configured to support the first movable electrode portion, wherein the first movable electrode portion and the second movable electrode portion is drawn together by an electrostatic attractive force generated by applying a voltage to each electrode of the first movable electrode portion and the second movable electrode portion to seal the fluid introduction port.

2. The valve element according to claim 1, wherein a plurality of sets of the fluid introduction port and the discharge port corresponding to the fluid introduction port.

3. The valve element according to claim 2, wherein the plurality of sets of the fluid introduction port and the discharge port corresponding to the fluid introduction port are arranged in an array.

* * * * *